(12) United States Patent
Bode et al.

(10) Patent No.: US 6,569,692 B1
(45) Date of Patent: May 27, 2003

(54) AUTOMATED METHOD OF CONTROLLING PHOTORESIST DEVELOP TIME TO CONTROL CRITICAL DIMENSIONS, AND SYSTEM FOR ACCOMPLISHING SAME

(75) Inventors: Christopher A. Bode, Austin, TX (US); Joyce S. Oey Hewett, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/776,087

(22) Filed: Feb. 2, 2001

(51) Int. Cl.$^7$ .......................... G01R 31/26; H01L 21/66
(52) U.S. Cl. ..................... 438/14; 438/16; 438/942
(58) Field of Search ..................... 438/14, 16, 17, 438/725, 780, 942

(56) References Cited

U.S. PATENT DOCUMENTS

| | | | |
|---|---|---|---|
| 5,926,690 A | * 7/1999 | Toprac et al. | 438/17 |
| 6,352,867 B1 | * 3/2002 | Couteau et al. | 438/17 |
| 6,368,879 B1 | * 4/2002 | Toprac | 438/5 |
| 6,368,883 B1 | * 4/2002 | Bode et al. | 438/14 |
| 6,388,253 B1 | 5/2002 | Su | 250/310 |

* cited by examiner

*Primary Examiner*—Amir Zarabian
*Assistant Examiner*—Jamie L. Brophy
(74) *Attorney, Agent, or Firm*—Williams, Morgan & Amerson (57) ABSTRACT

The present invention is directed to an automated method of controlling photoresist develop time to control critical dimensions, and a system for accomplishing same. In one embodiment, the method comprises measuring a critical dimension of each of a plurality of features formed in a layer of photoresist, providing the measured critical dimensions of the features, in the layer of photoresist to a controller that determines, based upon the measured critical dimensions, a duration of a photoresist develop process to be performed on a layer of photoresist formed above a subsequently processed wafer, and performing a photoresist develop process on the subsequently processed wafer for the determined duration.

19 Claims, 5 Drawing Sheets

AUTOMATED METHOD OF CONTROLLING PHOTORESIST DEVELOP TIME TO CONTROL CRITICAL DIMENSIONS, AND SYSTEM FOR ACCOMPLISHING SAME

BACKGROUND OF THE INVENTION

1. Field of the Invention

This invention relates generally to semiconductor fabrication technology, and, more particularly, to an automated method of controlling photoresist develop time to control critical dimensions, and system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Figure 1:
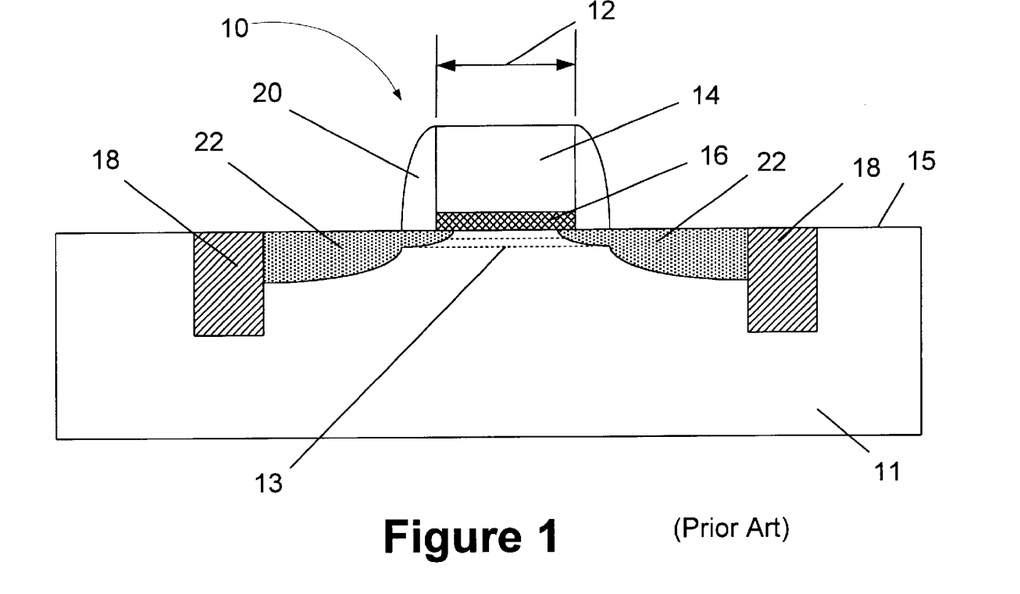
FIG. 1 is a cross-sectional view of an illustrative prior art transistor.

By way of background, an illustrative field effect transistor 10, as shown in FIG. 1, may be formed above a surface 15 of a semiconducting substrate or wafer 11, such as doped-silicon. The substrate 11 may be doped with either N-type or P-type dopant materials. The transistor 10 may have a doped-polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modem semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor processing involves, among other things, the formation of layers of various materials, e.g., polysilicon, insulating materials, etc., and selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., must be formed to very precisely controlled dimensions. Such dimensions are sometimes referred to as the critical dimension (CD) of the feature. It is very important in modern semiconductor processing that features be formed as accurately as possible due to the reduced size of those features in modern integrated circuit devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Moreover, it is also desirable that manufacturing operations produce such features in a consistent, reliable and predictable manner. That is, it is desirable that features be formed in a manner such that there is little variation in final feature sizes; despite forming millions of such features on different substrates using different process tools to form such features.

In modern semiconductor fabrication facilities, a variety of factors may tend to cause variations in the size of fabricated structures or features, as compared to the intended or design size of those features. For example, photolithography is a process typically employed in semiconductor manufacturing. Photolithography generally involves forming a patterned layer of photoresist above a layer of material that is desired to be patterned using the patterned photoresist layer as a mask. In general, the pattern desired to be formed in the underlying layer of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist reflecting the pattern on the reticle. This patterned layer of photoresist is then used as a mask in subsequent etching processes, wet or dry, performed on the underlying layer of material, e.g., a layer of polysilicon, metal or insulating material, to transfer the desired pattern to the underlying layer.

One problem that exists with existing photolithography processes is that, at the point in the process where the photoresist is developed, the desired dimensions of the feature formed in the layer of photoresist may be changed or eroded due to excessive time in the develop bath and/or variations in the chemistry used in the bath, etc. The problem may cause features in the underlying process layer to also be formed at dimensions that are different from those anticipated by the design process. For example, in forming line-type features, e.g., a gate electrode, excessive consumption of the feature formed in the layer of photoresist may lead to devices with gate electrodes having critical dimensions that are too small. While such a situation may, at least theoretically, increase the operating speed of the transistor by reducing the channel length, such a reduced size may also result in increased leakage currents and excessive power consumption, both of which are undesirable in modern integrated circuit devices. With respect to hole-type features, such excessive consumption results in holes in the process layer being formed to dimensions greater than anticipated by the design process. This may also be problematic given the densely packed nature of semiconductor devices.

Given the continual reduction of feature sizes in modern integrated circuit devices, it continues to be very important that feature sizes be defined as accurately as possible, and that such processes be repeatable. Thus, a need exists for a method and system that allows for automated control of the formation of critical feature dimensions in modern integrated circuit devices. The present invention is directed to a method and system that solves, or reduces, some or all of the aforementioned problems.

SUMMARY OF THE INVENTION

The present invention is directed to an automated method of controlling photoresist develop time to control critical dimensions, and system for accomplishing same. In one illustrative embodiment, the method comprises forming a process layer above a wafer and measuring a critical dimension of each of a plurality of features formed in a layer of photoresist formed above the process layer. The method further comprises providing the measured critical dimensions of the features to a controller that determines, based upon the measured critical dimensions, a duration of a photoresist develop process to be performed on a layer of photoresist formed above at least one subsequently processed wafer, forming a layer of photoresist above a process layer formed above the subsequently processed wafer, and performing the develop process on said layer of photoresist on the subsequently processed wafer for the determined duration.

In another embodiment, the method comprises forming a layer of photoresist above a process layer formed above a wafer, performing an exposure process on the layer of photoresist in a stepper tool, and measuring a critical dimension of each of a plurality of features formed in the layer of photoresist after the exposure process is performed but prior to a photoresist develop process being performed on the layer of photoresist. The method further comprises providing the measured critical dimensions of the features in the layer of photoresist to a controller that determines, based upon the measured critical dimensions, a duration of a photoresist develop process to be performed on the layer of photoresist, and performing the photoresist develop process on the layer of photoresist for the determined duration.

In one illustrative embodiment, the system disclosed herein comprises at least one metrology tool for determining a critical dimension of each of a plurality of features formed in a layer of photoresist formed above a process layer formed above a wafer, a controller that determines, based upon the measured critical dimensions of said features, a duration of a photoresist develop process to be performed on a layer of photoresist formed above at least one subsequently processed wafer, and a photoresist develop station wherein a photoresist develop process will be performed on the subsequently processed wafer for the determined duration.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to an automated method of controlling photoresist develop time to control critical dimensions, and system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above a process layer in which a feature, e.g., a metal line, a gate electrode, an opening in a layer of insulating material, will be formed. Thereafter, a pattern that is desired to be transferred into the underlying process layer will be formed in the layer of photoresist material. Then, using one or more etching processes, the underlying process layer is etched using the patterned layer of photoresist as a mask, thereby resulting in a patterned process layer that replicates the pattern formed in the layer of photoresist.

This process will be further described with reference to FIGS. 2A–2D. The dashed lines in FIGS. 2A–2D and 3A–3C are used to further explain the present invention, and they will be discussed further below after an initial discussion of FIGS. 2A–2D and 3A–3C.

Figure 2A:
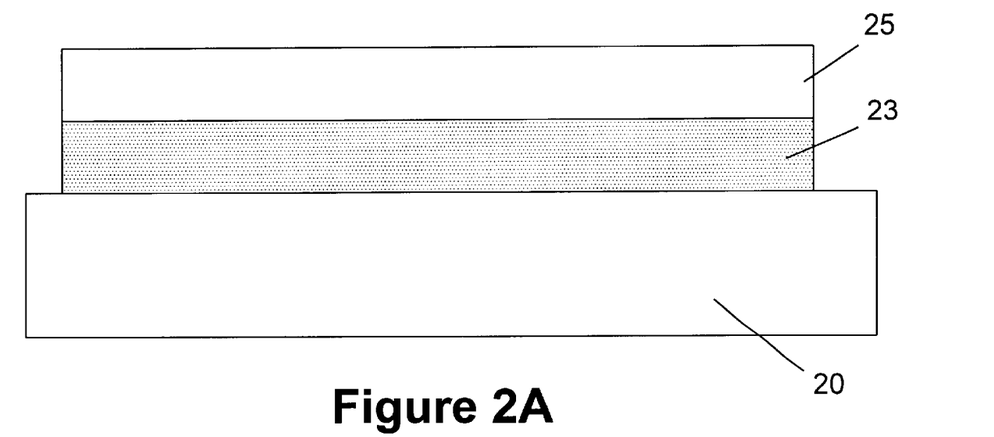
FIGS. 2A–2D are cross-sectional views depicting patterning operations performed on an illustrative wafer having a layer of photoresist and a process layer formed thereabove.

As shown in FIG. 2A, a process layer 23 is formed above a structure 20, and a layer of photoresist material 25 is formed above the process layer 23. As will be readily apparent to those skilled in the art after reading the present application, the structure 20 may be a semiconducting substrate, e.g., silicon, or it may represent one or more previously formed layers of material above such a semiconducting substrate, i.e., a stack of insulating layers each having a plurality of conductive interconnections formed therein. Similarly, the process layer 23 may be comprised of any type of material commonly encountered in semiconducting processing, e.g., it may be a layer of polysilicon, a layer of metal, e.g., aluminum, or it may be a layer of insulating material, e.g., a layer of silicon dioxide, HSQ, a layer of material having a dielectric constant greater than 3, etc. Moreover, the process layer 23 may be formed by a variety of techniques, e.g., chemical vapor deposition (CVD), physical vapor deposition (PVD), thermal growth, etc., and the thickness of the process layer 23 may vary greatly. Similarly, the layer of photoresist 25 may be either a positive or negative type photoresist, and it may be formed by a variety of techniques, e.g., a variety of spin-coating techniques commonly employed in modern semiconductor manufacturing.

Figure 2B:
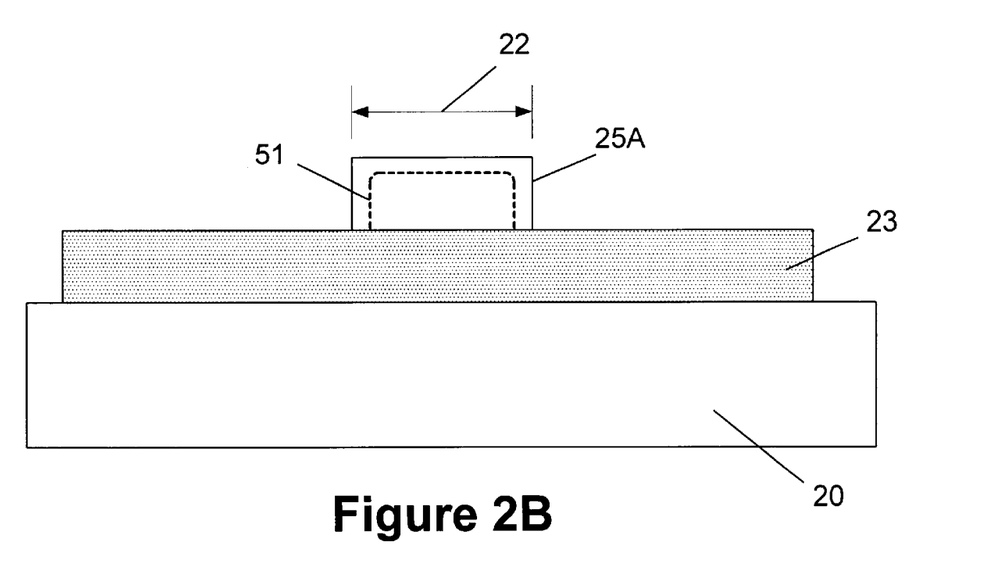

Next, as shown in FIG. 2B, the layer of photoresist 25 is patterned using known photolithography techniques to define a plurality of photoresist features 25A (only one of which is shown) above the process layer 23. In the embodiment depicted in FIG. 2B, the photoresist feature 25A is essentially an island of photoresist material that will be used as a mask in subsequent etching processes whereby a corresponding line-type feature will be formed in the underlying process layer 23. Of course, and as will be apparent to those skilled in the art upon a complete reading of the present application, the present invention may be used in both forming line-type features and/or opening-type features in the underlying process layer 23. The photoresist feature 25A has a critical dimension 22. This is sometimes referred to in the industry as a develop-inspect critical dimension (DICD), as it represents the critical dimension of the feature 25A after the photoresist has been completely developed.

Figure 2C:
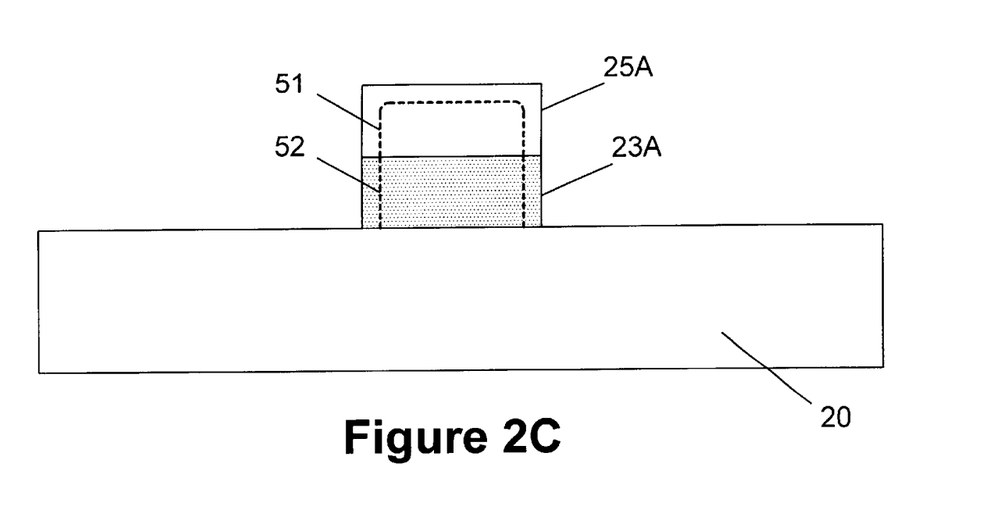
Figure 2D:
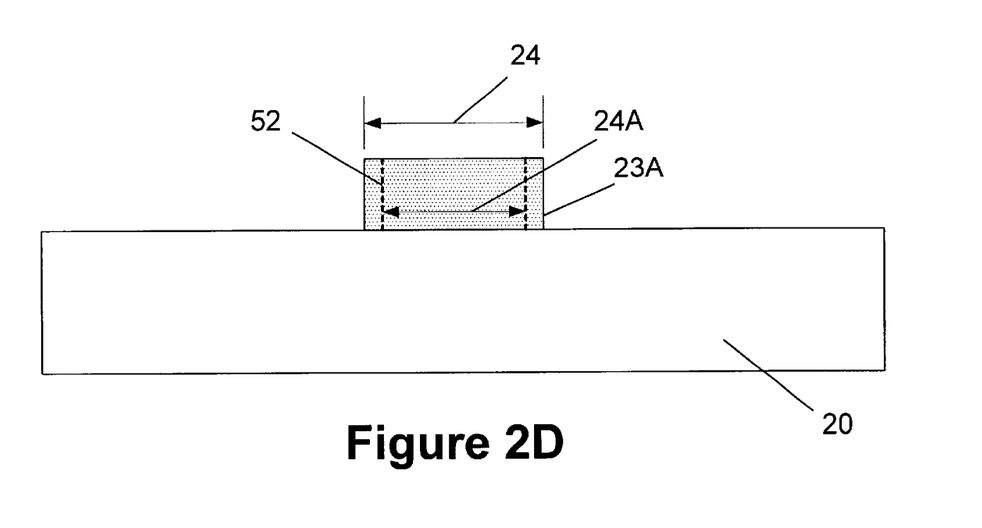

Then, as shown in FIG. 2C, one or more etching processes are performed, using the photoresist feature 25A as a mask, to result in the definition of a feature 23A in the process layer 23. As set forth previously, in the depicted embodiment shown in FIGS. 2A–2D, the feature 23A may represent a conductive line, a gate electrode for a transistor, or other such features commonly found on an integrated circuit device. Then, as shown in FIG. 2D, the photoresist feature 25A may be removed using known techniques. The remaining feature 23A formed in the process layer 23 has a critical dimension 24. This critical dimension 24 is sometimes referred to as the final-inspect critical dimension (FICD), as it reflects the final measured critical dimension of the as-fabricated feature.

Figure 3A:
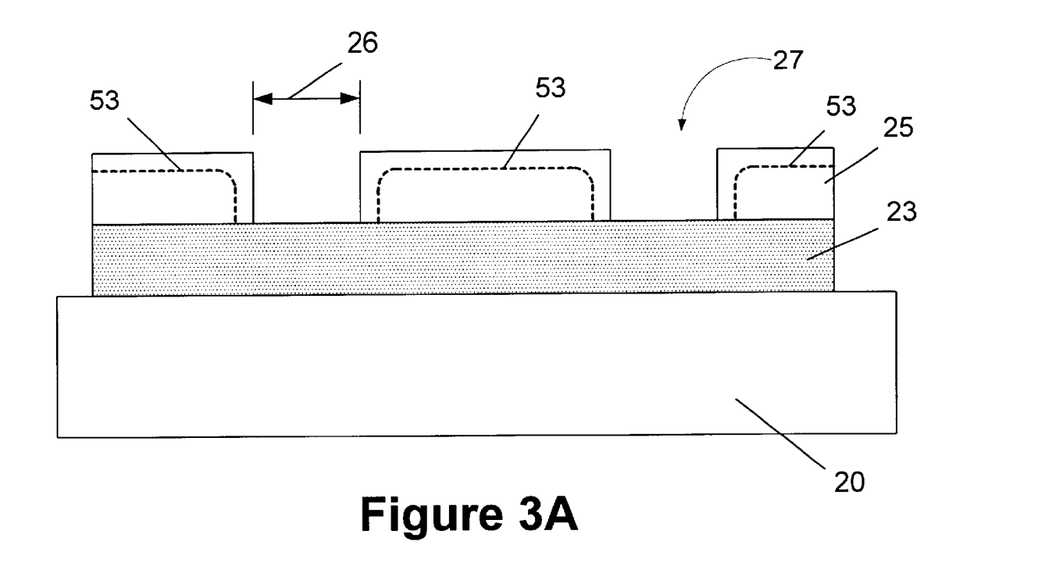
FIGS. 3A–3C are cross-sectional views depicting patterning operations performed on another illustrative wafer having a layer of photoresist and a process layer formed thereabove.
Figure 3B:
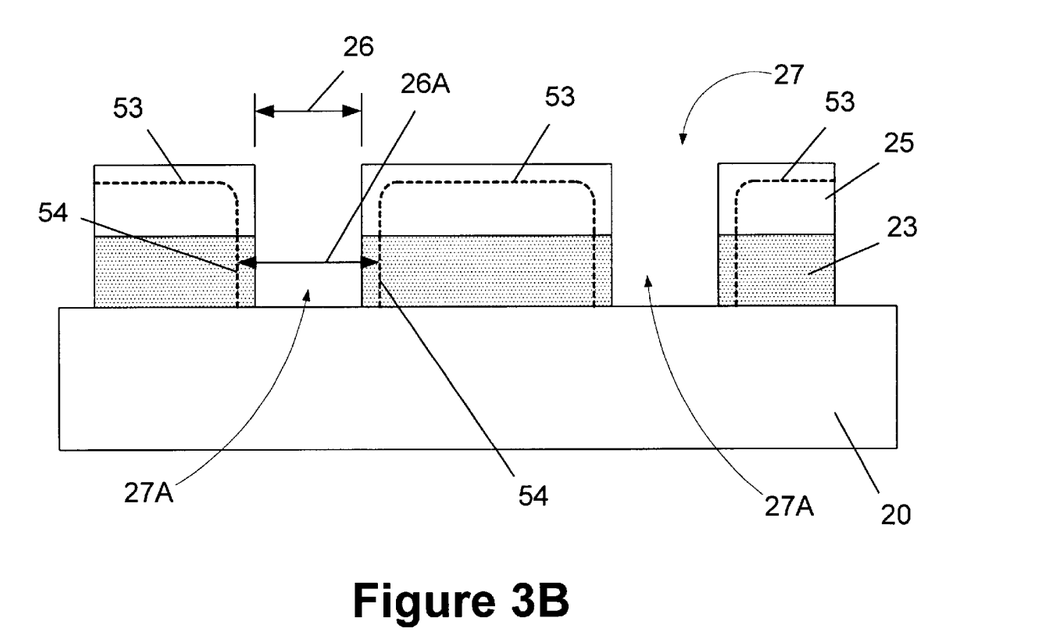
Figure 3C:
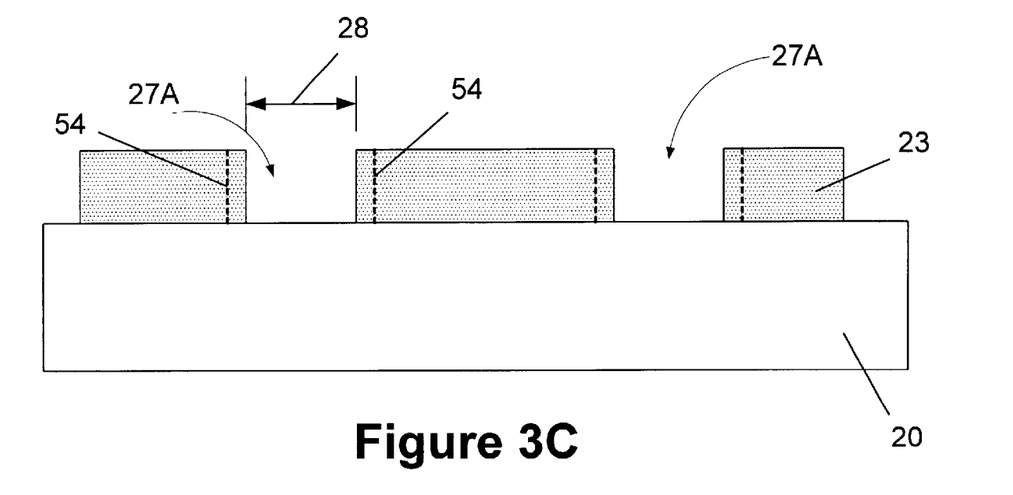

FIGS. 3A–3C depict yet another illustrative embodiment where opening-type features are formed in the underlying process layer 23 using known photolithography and etching techniques. For example, as shown in FIG. 3A, the layer of photoresist 25 has a plurality of openings 27 formed therein using known photolithography techniques. Thereafter, as illustrated in FIG. 3B, by performing one or more etching processes, and using the patterned layer of photoresist 25 as a mask, the underlying process layer 23 is etched resulting in openings 27A being formed in the process layer 23 that correspond with the openings 27 in the layer of photoresist 25. FIG. 3C depicts the situation where the patterned layer of photoresist 25 has been removed. The openings 27A in the process layer 23 may be openings in an insulating layer wherein conductive interconnections, i.e., conductive copper lines, contacts, vias, etc., may be formed. The openings 27 in the layer of photoresist 25 have a critical dimension 26, as indicated in the drawings, that may also be referred to as a DICD dimension. Similarly, the openings 27A formed in the process layer 23 have a critical dimension 28, as indicated in FIG. 3C, that may also be referred to as an FICD measurement, in that it reflects the actual critical dimension 28 of the as-fabricated openings 27 in the process layer 23.

The critical dimensions 24, 26 depicted in FIGS. 2A–2D and 3A–3C reflect the target values for those dimensions if everything goes according to plan in manufacturing operations. However, problems arise when the photoresist develop process is performed for too long (or in some cases too short) of a duration. This situation will also be discussed with references to FIGS. 2A–2D and 3A–3C. As shown in FIGS. 2A–2D, if the develop process time is excessive, or the develop process is otherwise overly aggressive, e.g., due to changes in chemistry, the photoresist feature 25A will be eroded to the extent indicated by dashed line 51 in FIG. 2B. As a result, after etching, the critical dimension of a feature, e.g., a gate electrode, will be less than anticipated and desired, as indicated by dashed line 52 in FIG. 2C. That is, the develop process may erode the photoresist feature 25A (see FIG. 2B) such that the feature 23A in the process layer 23 has a critical dimension 24A (see FIG. 2D) that is less than the targeted critical dimension 24. As set forth in the background section of the application, such a situation may be undesirable for a number of reasons. For example, if the feature under consideration is a gate electrode, patterning the feature to a size smaller than anticipated may lead to unexpected increases in leakage currents and power consumption, both of which are undesirable in modern integrated circuit devices.

Over-aggressive photoresist development can also cause problems with respect to patterning opening-type features in a process layer. For example, with reference to FIGS. 3A–3C, if the photoresist develop process is over-aggressive, e.g., if it is performed for too long a duration and/or if the chemistry is too aggressive, the resulting opening in the process layer 23 will be larger than anticipated. By way of example, if the photoresist develop process is too aggressive, the photoresist features shown in FIGS. 3A–3B may be eroded away to the amount indicated by dashed lines 53 in FIG. 3A. As a result, the features, e.g., opening, formed in the process layer 23 may be wider than anticipated, as indicated by dashed lines 54 in FIG. 3B. Accordingly, the opening may have a critical dimension 26A (see FIG. 3B) that is greater than the target critical dimension 26. This may be problematic in modem densely-packed integrated circuit devices. For example, due to the increase in the size of the opening, conductive lines formed in the opening may be closer to one another than anticipated, thereby increasing the capacitive coupling between the lines during operation.

Figure 4:
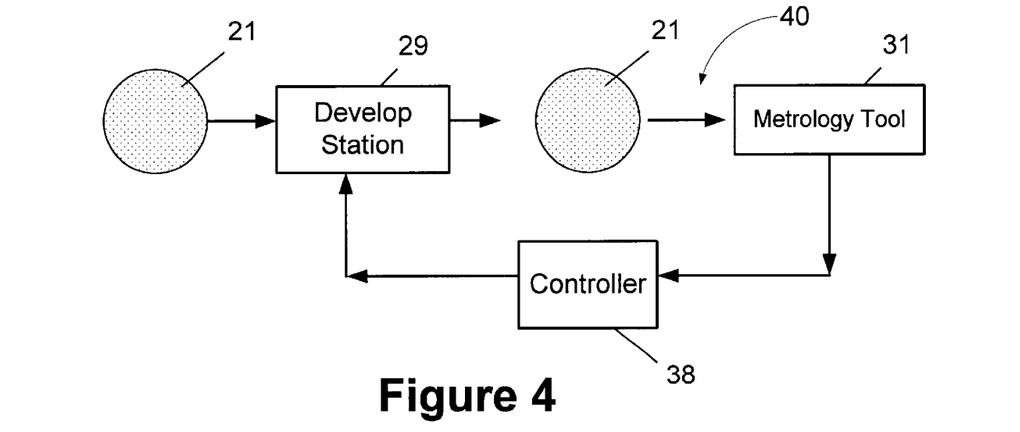
FIG. 4 depicts an illustrative embodiment of a system in accordance with one embodiment of the present invention.

An illustrative system 40 that may be used in one embodiment of the present invention is shown in FIG. 4. The system 40 is comprised of a develop station 29, one or more metrology tools 31, and a controller 38. As indicated in FIG. 4, illustrative wafer 21, having a layer of photoresist (not shown) formed above an underlying process layer (not shown) is subjected to a photoresist development process in the develop station 29 whereby the latent image in the layer of photoresist is turned into the final resist image, i.e., the relatively soluble portions of the photoresist layer are removed. After the development process is performed, the wafer 21 has a patterned layer of photoresist formed thereon. Thereafter, the wafer 21 is provided to the metrology tool 31.

As indicated in FIG. 4, in one embodiment, the critical dimensions of each of a plurality of features formed in the layer of photoresist 25, i.e., DICD dimensions, are measured by the metrology tool 31. The DICD measurements are provided to the controller 38, which determines or adjusts the duration of the develop process on subsequently processed wafers in the develop station 29 based upon the DICD measurements. That is, in the depicted embodiment, the DICD measurements are used to determine or adjust the duration of the develop process on subsequently processed wafers such that the DICDs of features in a layer of photoresist are maintained within acceptable limits. In this manner, features, e.g., gate electrodes, line widths, openings in insulation layers, etc., may be more accurately formed in integrated circuit devices, thereby enhancing device performance, and reducing costly rework when such errors are of an unacceptable level. The DICD measurements of the features in the layer of photoresist may be obtained by using a variety of tools capable of performing such measurements, e.g., scatterometers, an ellipsometer, a scanning electron microscope, etc.

By way of example only, take the situations where the features to be formed in the underlying process layer are line-type features, e.g., conductive metal lines, gate electrodes, etc. If the DICD measurements indicate that, after going through the develop process, the photoresist features have a critical dimension that is greater than the desired critical dimension of the photoresist features, the controller 38 may increase the duration of the develop process on subsequently processed wafers such that the photoresist features in layers of photoresist on subsequently processed wafers are driven toward the desired target value. Conversely, if the DICD measurements indicate that the critical dimensions of the photoresist features are less than a desired target value, the duration of the develop process performed on subsequently processed wafers may be decreased to thereby drive the critical dimension of features formed in photoresist layers on subsequently processed wafers to the desired target value.

In the case of forming opening-type features in process layers, the adjustment of the develop process is opposite to the adjustment of the develop process for line-type features. That is, if the DICD measurements of the critical dimension of openings in a layer of photoresist indicate that the critical dimension is too large, the duration of the develop process may be decreased on subsequently processed wafers. Conversely, if the DICD measurements indicate that the critical dimension is too small, the duration of the develop process may be increased.

The critical dimension measurements (DICD measurements) may be performed on any desired number of wafers. For example, such critical dimension measurements may be performed on all wafers in one or more lots, or on a representative number of wafers in a given lot, and these results may then be used to vary the duration of the develop process performed on subsequently processed wafers. Additionally, more than one lot of wafers may be analyzed until such time as the process engineer has achieved a sufficiently high degree of confidence that the testing accurately reflects the critical dimensions of the features under construction. Moreover, once the measurements are taken, they may be averaged or otherwise statistically analyzed in the controller 38 prior to making any determination as to whether to adjust the duration of the develop process.

In another illustrative embodiment, the present invention may be used in a feed forward technique to control the critical dimensions of features formed in a layer of photoresist 25. In this embodiment, after the layer of photoresist 25 has been subjected to an exposure process in a stepper tool, the dimension of the latent image formed in the layer of photoresist 25 may be measured using, for example, a scatterometry tool or a scanning electron microscope. This measurement may be taken before or after the post-exposure bake process commonly employed in modern photolithography operations. However, measurements taken after the post-exposure bake process would likely be more accurate. The measured critical dimensions of the latent features in the layer of photoresist 25 are then fed forward to the controller 38 that determines, based upon the pre-development measurements of the critical dimensions of the features formed in the layer of photoresist 25, the duration of the photoresist develop process to be performed on the layer of photoresist 25. If the critical dimensions of, for example, line-type features in the layer of photoresist 25 are less than a target value, the duration of the photoresist develop process is reduced or kept to a minimum. If the line-type features in the layer of photoresist 25 are greater than a target value, the duration of the photoresist develop process is increased. Converse adjustments can be made for hole-type features.

In the illustrated embodiment, the controller 38 is a computer programmed with software to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the metrology tool 31 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 Provisional Specification for CIM Framework Domain Architecture) and APC (SEMI E93-0999—Provisional Specification for CIM Framework Advanced Process Control Component) specifications are publicly available from SEMI.

The present invention is directed to an automated method of controlling photoresist develop time to control critical dimensions, and a system for accomplishing same. In one illustrative embodiment, the method comprises forming a process layer 23 above a wafer and measuring a critical dimension of each of a plurality of features formed in a layer of photoresist 25 formed above the process layer 23. The method further comprises providing the measured critical dimensions of the features to a controller 38 that determines, based upon the measured critical dimensions, a duration of a photoresist develop process to be performed on a layer of photoresist formed above a subsequently processed wafer, forming a layer of photoresist above a process layer formed above a subsequently processed wafer, and performing the develop process on the layer of photoresist on the subsequently processed wafer for the determined duration.

In another illustrative embodiment, the method disclosed herein comprises forming a layer of photoresist 25 above a process layer 23 formed above a wafer, performing an exposure process on the layer of photoresist 25 in a stepper tool, and measuring a critical dimension of each of a plurality of features formed in the layer of photoresist 25 after the exposure process is performed but prior to a photoresist develop process being performed on the layer of photoresist 25. The method further comprises providing the measured critical dimensions of the features in the layer of photoresist to a controller that determines, based upon the measured critical dimensions, a duration of a photoresist develop process to be performed on the layer of photoresist 25, and performing the photoresist develop process on the layer of photoresist 25 for the determined duration.

In one illustrative embodiment, the system disclosed herein comprises at least one metrology tool 31 for determining a critical dimension of each of a plurality of features formed in a layer of photoresist 25 formed above a process layer 23 formed above a wafer, a controller that determines, based upon the measured critical dimensions of said features, a duration of a photoresist develop process to be performed on a layer of photoresist formed above at least one subsequently processed wafer, and a photoresist develop station 29 wherein a photoresist develop process will be performed on the subsequently processed wafer for the determined duration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a first process layer above a wafer;

measuring a critical dimension of each of a plurality of features formed in a first layer of photoresist formed above said first process layer;

providing said measured critical dimensions of said features to a controller that determines, based upon said measured critical dimensions, a duration of a photoresist develop process to be performed on a second layer of photoresist formed above at least one subsequently processed wafer;

forming the second layer of photoresist above a second process layer formed above said at least one subsequently processed wafer; and performing said develop process on said second layer of photoresist on said at least one subsequently processed wafer for said determined duration.

2. The method of claim 1, wherein said plurality of features in said first layer of photoresist comprises at least one of a plurality of gate electrodes, a plurality of lines, and a plurality of openings to be formed in the first process layer.

3. The method of claim 1, wherein said controller is resident on a photolithography module that comprises a station wherein said photoresist develop process will be performed on said at least one subsequently processed wafer.

4. The method of claim 1, wherein measuring the critical dimension of each of the plurality of features comprises measuring the critical dimension of each of the plurality of features using a scanning electron microscope.

5. The method of claim 1, wherein said first layer of photoresist is formed by a spin-coating process.

6. The method of claim 1, wherein said first process layer is comprised of at least one of a metal, polysilicon, and an insulating material having a dielectric constant greater approximately 3.

7. The method of claim 1, wherein said duration of said photoresist develop process is increased if said features are line-type features and said critical dimensions are greater than a desired critical dimension.

8. The method of claim 1, wherein said duration of said photoresist develop process is decreased if said features are line-type features and said critical dimensions are less than a desired critical dimension.

9. The method of claim 1, wherein said duration of said photoresist develop process is decreased if said features are opening-type features and said critical dimensions are greater than a desired critical dimension.

10. The method of claim 1, wherein said duration of said photoresist develop process is increased if said features are opening-type features and said critical dimensions are less than a desired critical dimension.

11. A method, comprising:

measuring a critical dimension of each of a plurality of features formed in a first layer of photoresist that is formed above a first process layer formed above a wafer;

providing said measured critical dimensions of said features in said first layer of photoresist to a controller that determines, based upon said measured critical dimensions, a duration of a photoresist develop process to be performed on a second layer of photoresist formed above at least one subsequently processed wafer;

performing a spin-coating process to form the second layer of photoresist above a second process layer formed above a subsequently processed wafer; and performing said photoresist develop process on said second layer of photoresist on said at least one subsequently processed wafer for said determined duration.

12. The method of claim 11, wherein said plurality of features in said first layer of photoresist comprises at least one of a plurality of gate electrodes, a plurality of lines, and a plurality of openings in said first process layer.

13. The method of claim 11, wherein said controller is resident on a photolithography module that comprises a station wherein said photoresist develop process will be performed on said at least one subsequently processed wafer.

14. The method of claim 11, wherein measuring the critical dimension of each of the plurality of features comprises measuring the critical dimension of each of the plurality of features using a scanning electron microscope.

15. The method of claim 11, wherein said first process layer having said layer of photoresist formed thereabove is comprised of at least one of a metal, polysilicon, and an insulating material.having a dielectric constant greater than approximately 3.

16. The method of claim 11, wherein said duration of said photoresist develop process is increased if said features are line-type features and said critical dimensions are greater than a desired critical dimension.

17. The method of claim 11, wherein said duration of said photoresist develop process is decreased if said features are line-type features and said critical dimensions are less than a desired critical dimension.

18. The method of claim 11, wherein said duration of said photoresist develop process is decreased if said features are opening-type features and said critical dimensions are greater than a desired critical dimension.

19. The method of claim 11, wherein said duration of said photoresist develop process is increased if said features are opening-type features and said critical dimensions are less than a desired critical dimension.

* * * * *